United States Patent
Chen et al.

(10) Patent No.: US 12,032,022 B2
(45) Date of Patent: Jul. 9, 2024

(54) POWER CONSUMPTION MEASUREMENT ASSEMBLY AND METHOD, AND CHIP POWER CONSUMPTION MEASUREMENT DEVICE

(71) Applicant: CHANGXIN MEMORY TECHNOLOGIES, INC., Hefei (CN)

(72) Inventors: Xinwang Chen, Hefei (CN); Maosong Ma, Hefei (CN); Zhangqin Zhou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 319 days.

(21) Appl. No.: 17/447,428

(22) Filed: Sep. 12, 2021

(65) Prior Publication Data

US 2022/0099741 A1 Mar. 31, 2022

Related U.S. Application Data

(63) Continuation of application No. PCT/CN2021/103724, filed on Jun. 30, 2021.

(30) Foreign Application Priority Data

Sep. 30, 2020 (CN) .......................... 202011058673.4

(51) Int. Cl.
 *G01R 31/3185* (2006.01)
 *G01R 19/25* (2006.01)
 (Continued)

(52) U.S. Cl.
 CPC . *G01R 31/318575* (2013.01); *G01R 19/2503* (2013.01); *G01R 31/318597* (2013.01); *G01R 31/31924* (2013.01); *G01R 31/31932* (2013.01)

(58) Field of Classification Search
 CPC .. G01R 19/25; G01R 31/3185; G01R 31/319; G01R 31/3193; G01R 19/2503;
 (Continued)

(56) References Cited

U.S. PATENT DOCUMENTS 10,006,948 B2 6/2018 Cook
2012/0217954 A1 8/2012 Cook

FOREIGN PATENT DOCUMENTS

CN 201289504 Y 8/2009
CN 101930025 A * 12/2010 ............. G01R 21/00
(Continued)

OTHER PUBLICATIONS

English translated of CN 107991529 A (Year: 2018).*
(Continued)

*Primary Examiner* — Eman A Alkafawi
*Assistant Examiner* — Courtney G Mcdonnough
(74) *Attorney, Agent, or Firm* — Syncoda LLC; Feng Ma

(57) ABSTRACT

A power consumption measurement assembly includes: at least two sampling modules respectively connected to a circuit to be measured in series; a gating module configured to gate one of the at least two sampling modules; an amplifying module configured to acquire and amplify a voltage signal across the gated sampling module; and a processing module connected to the gating module and the amplifying module and configured to: control and adjust the gated sampling module and an amplification of the amplifying module, calculate a power consumption value based on the amplified voltage signal and transmit the power consumption value.

19 Claims, 6 Drawing Sheets

(51) Int. Cl.
*G01R 31/319* (2006.01)
*G01R 31/3193* (2006.01)

(58) Field of Classification Search
CPC ............... G01R 21/00; G01R 31/2851; G01R 31/318575; G01R 31/318597; G01R 31/31924; G01R 31/31932
USPC ........................................................ 324/537
See application file for complete search history.

(56) References Cited

FOREIGN PATENT DOCUMENTS

| | | | |
|---|---|---|---|
| CN | 101930025 A | 12/2010 | |
| CN | 102298110 A | 12/2011 | |
| CN | 102353836 A | 2/2012 | |
| CN | 103698594 A | 4/2014 | |
| CN | 104569700 A | 4/2015 | |
| CN | 205015773 U | 2/2016 | |
| CN | 205157760 U | 4/2016 | |
| CN | 106066422 A | 11/2016 | |
| CN | 106093528 A | 11/2016 | |
| CN | 106291066 A | 1/2017 | |
| CN | 206311666 U | 7/2017 | |
| CN | 107231190 A | 10/2017 | |
| CN | 107991529 A | 5/2018 | |
| CN | 107991529 A * | 5/2018 | ........... G01R 21/133 |
| CN | 108037449 A | 5/2018 | |
| CN | 207557344 U | 6/2018 | |
| CN | 207817038 U | 9/2018 | |
| CN | 108872748 A | 11/2018 | |
| CN | 105759114 B | 3/2019 | |
| CN | 211123025 U | 7/2020 | |
| CN | 211123025 U * | 7/2020 | ............. G01R 21/00 |
| CN | 111665380 A | 9/2020 | |
| CN | 111707869 A | 9/2020 | |
| CN | 211426630 U | 9/2020 | |

OTHER PUBLICATIONS

English translated of CN 101930025 A (Year: 2010).*
English translated of CN 211123025 U (Year: 2020).*
First Office Action of the Chinese application No. 202011058673.4, issued on May 25, 2023. 9 pages with English abstract.
CX3300 Datasheet, https://www.keysight.com/US/en/assets/7018-05167/data-sheets/5992-1430.pdf, CX3300A Series Device Current Waveform Analyzer.

* cited by examiner

POWER CONSUMPTION MEASUREMENT ASSEMBLY AND METHOD, AND CHIP POWER CONSUMPTION MEASUREMENT DEVICE

CROSS-REFERENCE TO RELATED APPLICATIONS

This is a continuation of International Patent Application No. PCT/CN2021/103724 filed on Jun. 30, 2021, which claims priority to Chinese Patent Application No. 202011058673.4 filed on Sep. 30, 2020. The disclosures of these applications are hereby incorporated by reference in their entirety.

BACKGROUND

Generally, a power consumption of a chip is an essential performance parameter in both chip design and operation phases. A chip with great power consumption has a great influence on various aspects such as heat radiation and operation environment. Therefore, it is very important to measure the power consumption.

SUMMARY

Embodiments of the disclosure relate to the field of integrated circuit technologies, in particular to a power consumption measurement assembly and a method, and a chip power consumption measurement device.

According to an aspect of embodiments of the disclosure, a power consumption measurement assembly is provided and applied to a circuit to be measured, and the power consumption measurement assembly includes at least two sampling circuitries, a gating circuitry, an amplifying circuitry and a processing circuitry.

The at least two sampling circuitries are respectively connected to the circuit to be measured in series.

The gating circuitry is configured to gate one of the at least two sampling circuitries.

The amplifying circuitry is configured to acquire and amplify a voltage signal across the gated sampling circuitry.

The processing circuitry is connected to the gating circuitry and the amplifying circuitry, and configured to control and adjust the gated sampling circuitry and an amplification of the amplifying circuitry, calculate a power consumption value based on the amplified voltage signal and transmit the power consumption value.

According to an aspect of the embodiments of the disclosure, a power consumption measurement method is provided and is applied to a power consumption measurement assembly, and the method includes the following operations.

A gated sampling circuitry and an amplification of an amplifying circuitry of the power consumption measurement assembly are controlled and adjusted.

A voltage signal across the gated sampling circuitry is acquired and amplified.

A power consumption value is calculated based on the amplified voltage signal, and the power consumption value is transmitted.

According to an aspect of the embodiments of the disclosure, a chip power consumption measurement device is provided and includes a chip and a power consumption measurement assembly. The power consumption measurement assembly includes at least two sampling circuitries, a gating circuitry, an amplifying circuitry and a processing circuitry. The at least two sampling circuitries are respectively connected to the chip in series. The gating circuitry is configured to gate one of the at least two sampling circuitries. The amplifying circuitry is configured to acquire and amplify a voltage signal across the gated sampling circuitry. The processing circuitry is connected to the gating circuitry and the amplifying circuitry, and configured to control and adjust the gated sampling circuitry and an amplification of the amplifying circuitry, calculate a power consumption value based on the amplified voltage signal and transmit the power consumption value.

The at least two sampling circuitries of the power consumption measurement assembly are respectively connected to a power supply pin of the chip in series.

It should be understood that above general description and the detailed description below are only illustrative and explanatory and not intended to limit the embodiments of the disclosure.

BRIEF DESCRIPTION OF THE DRAWINGS

The accompanying drawings, which are incorporated in and constitute a part of this specification, illustrate embodiments consistent with the embodiments of the disclosure and, together with the description, serve to explain the principles of the embodiments of the disclosure. It is apparent that the accompanying drawings described below are merely some of the embodiments of the disclosure, based on which other drawings may be obtained by a person of ordinary skill in the art without any creative effort.

DETAILED DESCRIPTION

Figure 1:
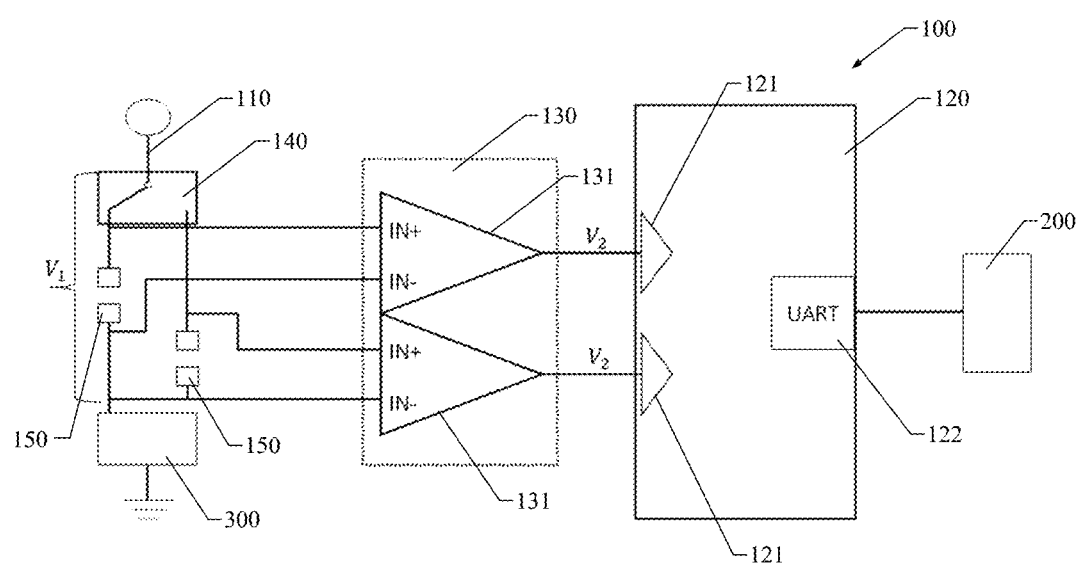
FIG. 1 schematically illustrates a schematic diagram of a structure of a power consumption measurement assembly according to an exemplary implementation of the embodiments of the disclosure.

Exemplary embodiments will now be described more fully with reference to the accompanying drawings. However, the exemplary embodiments can be implemented in various forms and should not be understood as being limited the examples set forth herein, rather, these embodiments are provided to make the embodiments of the disclosure more thorough and complete, and to fully convey the concepts of the example embodiments to those skilled in the art. The same reference numbers in the drawing are used to depict the same or similar structures, so their detailed description will be omitted.

Although terms such as "on" and "below" are used in the disclosure to describe a relative relationship between an assembly and another assembly referenced in the drawings, these terms are only used for ease of description, for example, according to an example direction illustrated in the drawings. It should be understood that if the device referenced in the drawings is turned upside down, the assembly described as "on" others will become an assembly "below" others. Other relative terms, such as "high", "low", "top", "bottom", "left" and "right" also have similar meanings. A structure "on" another structure may mean that the structure is integrally formed on said another structure, or the structure is "directly" arranged on said another structure or "indirectly" arranged on said another structure through other structures.

Terms like "one", "a/an", "the" are intended to describe one or more elements/constituent components/etc. Terms like "include/includes" and "have/has" are intended to express an open including which may include additional elements/constituent components/etc., in addition to the listed elements/constituent components/etc.

A Synchronous Dynamic Random-Access Memory (SDRAM) is a common semiconductor memory device used in computers. Since a power supply voltage of the SDRAM chip is fixed, only a current needs to be measured when measuring the power consumption of a power supply group on the SDRAM chip. The traditional current measurement method comprises connecting a current sampling resistor to a power supply signal in series, measuring a voltage drop across the current sampling resistor by a multimeter or an oscilloscope, and dividing the voltage drop by a resistance value of the current sampling resistor to calculate the current.

In the field of integrated circuit technologies, particularly in a process of designing embedded systems, the calculation of power consumption is an inevitable problem. In the process of calculation of the power consumption, the power consumption of dynamic random memories, such as the SDRAM, a Double Data Rate SDRAM (DDR SDRAM), a Double Data Rate 2 SDRAM (DDR2 SDRAM) are especially difficult to be obtained and calculated. Moreover, the traditional current measurement method cannot satisfy requirements of an excessively large current dynamic range of various power groups in the SDRAM chip.

With respect to a chip, an important premise of reducing the power consumption of the chip is detection of the power consumption of the chip. In an exemplary implementation of the embodiments of the disclosure, a power consumption measurement assembly is provided and used for measurement of the power consumption. The power consumption measurement assembly is able to be used not only for measurement of the power consumption of the above SDRAM chip (such as SDR, DDR-DDR5, Low Power Double Data Rate (LPDDR)-LPDDR5), but also for measurement of other chips such as a Central Processing Unit (CPU) chip and a chip of a calorimeter. The power consumption measurement assembly is especially suitable for devices with a wide changing range of the power consumption.

For the chip, static power consumption and dynamic power consumption are two main power consumption sources. The dynamic power consumption comes from turnover power consumption and short-circuit power consumption when load capacitor is charged and discharged. The static power consumption comes from: a sub-threshold leakage current flowing through a cut-off transistor, a leakage current flowing through a gate dielectric, a leakage current in a source-drain diffusion region, and a competitive current in a ratio circuit. The power consumption measurement assembly provided in the exemplary implementation of the embodiments of the disclosure can be used for measurement of both the dynamic power consumption and the static power consumption.

The power consumption measurement assembly in the exemplary implementation of the embodiments of the disclosure is described below in combination with specific embodiments.

Referring to FIG. 1, FIG. 1 schematically illustrates a schematic diagram of a structure of a power consumption measurement assembly according to an exemplary implementation of the embodiments of the disclosure. As illustrated in FIG. 1, the power consumption measurement assembly 100 provided in the exemplary implementation is applied to a circuit to be measured 110. Herein, the circuit to be measured 110 may be a circuit of which the power consumption needs to be measured, such as a power supply circuit in the SDRAM chip.

In an exemplary implementation of the embodiments of the disclosure, the power consumption measurement assembly 100 specifically includes: a processing module 120, an amplifying module 130, a gating module 140 and at least two sampling modules 150. The at least two sampling modules 150 are respectively connected to the circuit to be measured 110 in series; the gating module 140 is configured to gate one of the at least two sampling modules; the amplifying module 130 is configured to acquire and amplify a voltage signal across the gated sampling module 150; and the processing module 120 is connected to the gating module 140 and the amplifying module 130 and is configured to: control and adjust the gated sampling module 150 and an amplification of the amplifying module 130, calculate a power consumption value based on the amplified voltage signal, and transmit the power consumption value.

In an exemplary implementation of the embodiments of the disclosure, the at least two sampling modules 150 are respectively connected to the circuit to be measured 110 in series, an appropriate sampling module 150 may be selected based on an actual changing range of a current of the circuit to be measured 110. In such way, measurement accuracy can be increased, and a measurement range of the current flowing through the circuit to be measured 110 can also be increased. Therefore, a larger current dynamic range of a device such as the SDRAM chip in different operating conditions can be measured.

In a practical application, the at least two sampling modules 150 may be at least two sampling resistors, and the at least two sampling resistors may have different resistance values, the different resistance values will result in different voltage drops. When the current of the circuit to be measured 110 is relatively small, the sampling module 150 with a larger resistance value may be selected to increase the voltage drop across the sampling module 150, and thus a more accurate result can be obtained. When the current of the circuit 100 to be measured is relatively large, the sampling module 150 with a smaller resistance value may be selected, thus the voltage drop across the sampling module 150 can be reduced while a more accurate result is obtained, and requirements of operating voltage of the chip 300 can be satisfied.

In a practical application, a resistance value range of the sampling resistor may be set based on the actual requirements. For example, in an exemplary implementation of the embodiments of the disclosure, the resistance value range of each of the at least two sampling resistors may be 50 mΩ-10Ω. It is to be noted that any resistance value range of the sampling resistor satisfying the measuring requirements shall fall within the scope of the embodiments of the disclosure.

In a practical application, a number of the sampling modules 150 may be two, three or more. The specific number of the sampling module 150 may be determined based on an actual range of the current to be measured of the circuit to be measured 110. When the actual current range is very large, a plurality of sampling modules 150 with different resistance values may be provided.

In an exemplary implementation of the embodiments of the disclosure, since the power supply voltage on the chips such as the SDRAM chip are fixed, the above sampling module 150 may be a current sampling resistor and is mainly configured to measure the current of the circuit to be measured 110, and the power consumption may be obtained by a product of the above current and the power supply voltage. Compared with the voltage sampling resistor, the current sampling resistor has a smaller resistance value and a smaller power consumption, which can reduce the power consumption in the measurement process.

In an exemplary implementation of the embodiments of the disclosure, the gating module 140 is provided in the power consumption measurement assembly 100, the gating module 140 is arranged on the circuit to be measured 110 and is configured to gate one of at least two sampling modules. For example, the gating module 140 may be arranged between the power supply of the circuit to be measured 110 and the sampling module 150, to switch between signals of the at least two sampling modules 150.

In a practical application, the gating module 140 may be, for example, an analog switch, a relay or a photoelectric switch. Herein, the analog switch may use a switching manner of a Metal Oxide Semiconductor (MOS) transistor to turn off or turn on a signal link, so as to achieve higher turn-off impedance and lower conduction impedance. For example, the resistance value of the gating module 140 may be 5 mΩ when the gating module 140 is turned on, and the resistance value may be greater than 10 KΩ when the gating module 140 is turned off, which are not specifically limited in the exemplary implementation.

In an exemplary implementation of the embodiments of the disclosure, the voltage signal across the gated sampling module 150 may be amplified by the amplifying module 130 provided in the power consumption measurement assembly 100. Therefore, the processing module 120 is able to acquire and identify the voltage signal, which provides a basis for the sampling module 150 to acquire a smaller current, in such way, the current range of the circuit 110 to be measured that can be measured by the power consumption measurement assembly 100 can be increased.

In an exemplary implementation of the embodiments of the disclosure, the amplifying module 130 includes at least two optional amplifications. The measurable current range of the power consumption measurement assembly 100 may be expanded by using different sampling modules 150 and different amplifications, therefore, more requirements of the current measurement range can be satisfied. The amplifying module 130 may be a variable gain amplifier.

In a practical application, the amplification of the amplifying module 130 may be set according to actual needs. For example, in an exemplary implementation of the embodiments of the disclosure, the amplification of the amplifying module 130 may be 10 times-200 times. It is to be noted that any amplification of the amplifying module 130 satisfying the measuring requirements shall fall within the scope of the embodiments of the disclosure.

In a practical application, the amplification of the amplifying module 130 may be adjustable, and a number and values of the amplifications may be determined based on the current range of the circuit to be measured 110. For example, in an exemplary implementation of the embodiments of the disclosure, the amplifying module 130 of the power consumption measurement assembly 100 has at least two optional amplifications, for example, 10 times and 100 times. In a case where the voltage input to the amplifying module 130 is 1 mV, and the amplification is 10 times, the voltage output by the amplifying module 130 is 10 mV, and when the amplification is 100 times, the voltage output by the amplifying module 130 is 0.1V. The specific amplification of the amplifying module 130 is not specifically limited in the exemplary implementation.

In an exemplary implementation of the embodiments of the disclosure, the amplifying module 130 has at least two channels 131, and the at least two channels are configured to acquire the respective voltage drops across different sampling modules 150. Herein, an input of each of the channels 131 is connected to two ends of a respective one of the at least two sampling modules 150, and an output of each of the channels 131 is connected to a respective one of analog-digital converters 121. In other words, an input of one of the channels 131 is connected to two ends of one of the at least two sampling modules 150, and the output of said one channel 131 is connected to one of the analog-to-digital converters 121; an input of another one of the channels 131 is connected to two ends of another one of the sampling modules 150, and the output of said another channel 131 is connected to another one of the analog-to-digital converters 121.

In an exemplary implementation of the embodiments of the disclosure, the processing module 120 is also arranged in the power consumption measurement assembly 100. The processing module (such as microcontrollers) 120 is an integrated circuit chip, which integrates a central processing unit with data processing ability, a random access memory, a read-only memory, a plurality of I/O ports and interrupt system, a timer/counter function (may further include a display drive circuit, a pulse width modulation circuit, an analog multiplexer, and the analog-digital converter) into a small and perfect microcomputer system formed on a silicon wafer by adopting a very large scale integration circuit technology. The voltage signal amplified by the amplifying module 130 may be acquired and identified by the processing module 120, and the voltage signal is converted into a digital signal, then the power consumption value is calculated based on the digital signal, and the power consumption value is transmitted to an upper computer 200, etc.

In an exemplary implementation of the embodiments of the disclosure, the processing module 120 is connected to the gating module 140, to control the gating module 140 to gate a required sampling module 150, and thus the appropriate sampling module 150 can be selected from the at least two sampling modules 150. In addition, the processing module 120 is also connected to the amplifying module 130 to control the amplification of the amplifying module 130, in such way, the appropriate sampling module 150 and appropriate amplification can be selected according to the actual current flowing through the circuit to be measured 110. Therefore, requirements of the current measurement of the circuit to be measured can be satisfied while a voltage drop range of the sampling module 150 is satisfied, moreover, the power consumption can be reduced and the energy can be saved.

Compared to an external device, such as the multimeter/oscilloscope, which has a poor data processing and data analysis ability, the power consumption measurement assembly 100 according to the exemplary implementation of the embodiments of the disclosure is provided with the processing module 120, thus the power consumption measurement assembly 100 can implement control such as gating the sampling module 150, selecting the amplification and data processing and analysis by itself, and there may no need to connect with other external devices. Moreover, the power consumption measurement assembly has a better data processing and analysis ability, a faster processing speed and a higher accuracy.

In an exemplary implementation of the embodiments of the disclosure, the processing module 120 includes: an analog-digital converter 121, a calculation module, a serial port 122 and a control logic module. The analog-digital converter 121 is connected to the amplifying module 130 and configured to convert the voltage signal into a digital signal, so as to facilitate the operation of the calculation module. The calculation module is configured to calculate the power consumption value based on the digital signal. The serial port 122 is configured to connect to the upper computer 200 and transmit the power consumption value to the upper computer 200. The control logic module is configured to control and adjust the gated sampling module 150 and the amplification of the amplifying module 130.

Specifically, the control logic module is configured to determine the gated sampling module 150 and the amplification of the amplifying module 130 based on a current range of the circuit to be measured 110, a convertible voltage range of the analog-digital converter 121 and a voltage drop range of the gating module 140 and the gated sampling module 150.

In a practical application, two analog-digital converters 121 may be provided, and one analog-digital converter 121 corresponds to one amplifying module 130, so as to convert the analog voltage signal which is amplified by the amplifying module 130 and is continuous in time and amplitude into the digital signal which is discrete in time and amplitude.

Generally, the analog-digital converter 121 has a convertible voltage range, and the voltage signal amplified by the amplifying module 130 needs to meet the convertible voltage range. In a practical application, the convertible voltage range of the analog-digital converter 121 may be 10 mV-2V, which is not specifically limited in the exemplary implementation.

In an exemplary implementation of the embodiments of the disclosure, the calculation module may calculate the current I of the circuit to be measured 110 based on the above digital signal in combination with the resistance value R of the sampling module 150, further, in combination with the power supply voltage U of the power supply, the power consumption value $P=I \times U$ of the power supply may be calculate.

In an exemplary implementation of the embodiments of the disclosure, the serial port 122 may be a Universal Asynchronous Receiver/Transmitter (UART), to adapt to a situation of short distance and low rate. In addition, the serial port 122 may also be other synchronized serial ports, which is not specifically limited in the exemplary implementation.

In a practical application, in order to facilitate the communication between the UART and the upper computer 200, a Universal Serial Bus (USB)-to-serial module is required to connect the UART with a USB interface of the upper computer 200.

Optionally, the processing module 120 may be a single-chip microcomputer.

The single-chip microcomputer may be a single-chip microcomputer with or without a analog-digital converter. In an exemplary implementation of the embodiments of the disclosure, in order to reduce a volume of the power consumption measurement assembly 100, the processing module 120 may be selected from a single-chip microcomputer internally provided with a crystal oscillator and the analog-digital converter.

In an exemplary implementation of the embodiments of the disclosure, the power consumption measurement assembly 100 further includes a substrate. The at least two sampling modules 150, the gating module 140, the amplifying module 130 and the processing module 120 are arranged on the substrate. A size and shape of the substrate are determined based on a total area occupied by components to be arranged on the substrate, and the substrate may be a copper-clad laminate, which is not specifically limited in the exemplary implementation.

In an exemplary implementation of the embodiments of the disclosure, a number of the power consumption measurement assemblies 100 may be determined based on a number of the power supply signals to be measured in the chip 300, specifically, one power signal corresponds to one power consumption measurement assembly 100.

According to the power consumption measurement assembly 100 in the exemplary embodiments, in an aspect, at least two sampling modules 150 are respectively connected to the circuit to be measured 110 in series, the current measurement range of the power consumption measurement assembly 100 can be increased and more types of current changes of the circuit to be measured 110 can be satisfied. In another aspect, the voltage signal across the sampling module 150 is amplified by the amplifying module 130, to facilitate the processing module 120 to acquire and identify the voltage signal. On such basis, the sampling module 150 can acquire smaller currents, and the current measurement range of the power consumption measurement assembly 100 can be further increased, and more requirements can be satisfied. In yet another aspect, in the exemplary implementations, the power consumption measurement assembly 100 is provided with the processing module 120, the appropriate sampling module 150 and appropriate amplification can be selected according to the actual current of the circuit to be measured 110. Therefore, requirements of the current measurement can be satisfied while a voltage drop range of the sampling module 150 is satisfied. Moreover, the components used in the power consumption measurement assembly 100 are common components, instead of high-end current measurement components with a high precision, therefore, the measurement cost of the measurement assembly is relatively low, and the power consumption can be reduced and the energy can be saved.

Figure 2:
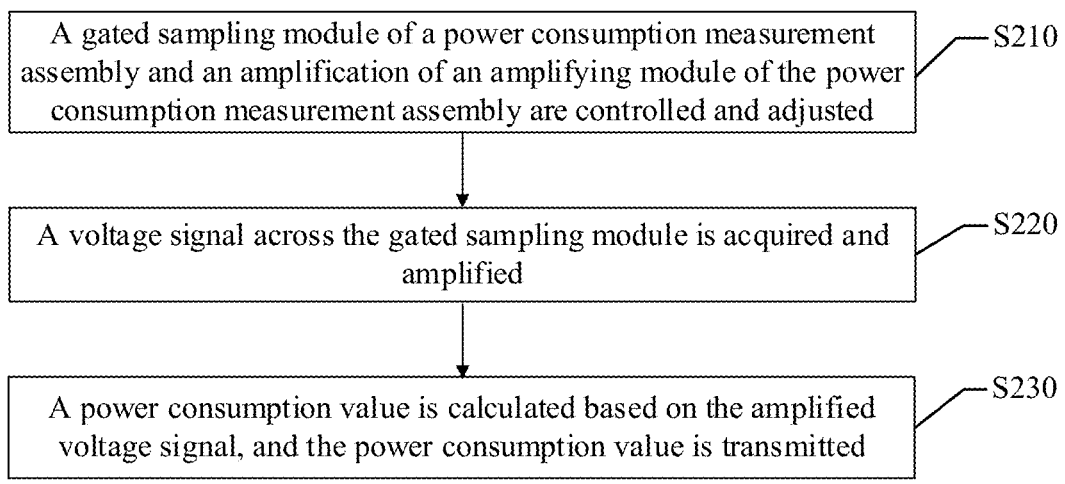
FIG. 2 schematically illustrates a flowchart of a power consumption measurement method according to an exemplary implementation of the embodiments of the disclosure.

In an exemplary implementation of the embodiments of the disclosure, a power consumption measurement method is further provided. Referring to FIG. 2, FIG. 2 schematically illustrates a flowchart of a power consumption measurement method according to an exemplary implementation of the embodiments of the disclosure. As illustrated in FIG. 2, the power consumption measurement method is applied to the above power consumption measurement assembly 100. Specifically, the method is executed by the control logic module in the power consumption measurement assembly 100. The power consumption measurement method specifically includes the following operations.

At S210, a gated sampling module of the power consumption measurement assembly and an amplification of an amplifying module of the power consumption measurement assembly are controlled and adjusted.

At S220, A voltage signal across the gated sampling module is acquired and amplified.

At S230, A power consumption value is calculated based on the amplified voltage signal, and the power consumption value is transmitted.

According to the power consumption measurement method in the exemplary implementation, in an aspect, different sampling modules may be gated by adjusting and the amplification of the amplifying module may be adjusted, the current measurement range can be increased, and more types of current changes of the circuit to be measured 110 can be satisfied. In another aspect, the appropriate sampling module and appropriate amplification can be selected according to the actual current of the circuit to be measured. Therefore, requirements of the current measurement can be satisfied while a voltage drop range of the sampling resistor is satisfied, moreover, the power consumption can be reduced and the energy can be saved.

In the exemplary implementation, gating of the sampling module 150 is realized by selecting different channels by the gating module 140. The power consumption measurement method may specifically include the following operations.

The operation of controlling and adjusting the gated sampling module 150 and the amplification of the amplifying module 130 may specifically include the following actions.

A current acquiring operation is performed, and the current acquiring operation includes controlling the gating module 140 of the power consumption measurement assembly 100 to gate the sampling module 150 and controlling the amplification of the amplifying module 130.

The amplifying module 130 is controlled to acquire and amplify the voltage signal across the gated sampling module 150.

A current value and a power consumption value corresponding to the amplified voltage signal are calculated.

The current value is compared with a measurable current range of the power consumption measurement assembly.

In response to the current value being in the measurable current range, the power consumption value is transmitted and the current acquiring operation is proceeded to be performed.

In response to the current value being not in the measurable current range, at least one of the gated sampling module or the amplification of the amplifying module is adjusted, and the current acquiring operation is proceeded to be performed.

In a practical operation process, a number of the used sampling modules 150 and the amplification of the amplification module 130 may be specifically determined based on the current range of the circuit to be measured, and different measurable current ranges may be obtained through the combination of the number and the amplification. Then, the current range of the circuit to be measured may be obtained through a combination of different measurable current ranges, to enable the power consumption measurement assembly 100 to meet the requirements of a full range of the circuit to be measured.

The above method is decomposed as follows. Taking two sampling modules 150 including a first resistance value and a second resistance value, and the amplifying module 130 including two amplifications: the first amplification and the second amplification as an example, the above method is specifically described below.

It is assumed that the above power consumption measurement method is used for measuring the dynamic power consumption of the SDRAM chip. For the SDRAM chip, the current range of the circuit to be measured 110 of the SDRAM chip is 10 uA-500 mA, the convertible voltage range of the analog-digital converter 121 is 10 mV-2V, and a sum of the voltage drops of the gating module 140 and the sampling module 150 is less than or equal to 50 mV. In an exemplary implementation of the embodiments of the disclosure, the resistance value of the gating module 140 when it is turned on is determined as 5 mΩ, and the resistance value of the gating module 140 when it is turned off is greater than 10 KΩ. The resistance value of one of the sampling modules 150 is determined as a first resistance value of 50 mΩ, and the resistance value of the other sampling module 150 is determined as a second resistance value of 10Ω. The amplification of the amplifying module 130 can be selected from the first amplification of 10 times and the second amplification of 100 times.

Four state combinations may be obtained according to the two sampling modules 150 and two amplifications: state 1, state 2, state 3 and state 4. In each state, the range of the sum V1 of voltage drops across the gating module 140 and the sampling module 150, the range of the voltage V2 obtained by amplifying the voltage drop of the sampling module 150 by the amplifying module 130 and the range of the measurable current I are as shown in Table 1.

TABLE 1

| State | Resistance value of sampling module | $V_1$ | Amplification | $V_2$ | I |
|---|---|---|---|---|---|
| 1 | 50 mΩ | 1.1 mV-49.955 mV | 10 | 10 mV-454.5 mV | 20 mA-909 mA |
| 2 | 50 mΩ | 0.11 mV-22 mV | 100 | 10 mV-2 V | 2 mA-400 mA |
| 3 | 10 Ω | 0.1 mV-20.01 mV | 100 | 10 mV-2 V | 10 μA-2 mA |
| 4 | 10 Ω | 1 mV-50 mV | 10 | 10 mV-499.8 mV | 100 μA-4.998 mA |

As can be seen from the above calculation results shown in Table 1, in the above four states, the voltages V2 amplified by the amplifying module 130 are all within the convertible voltage range of 10 MV-2V of the analog-digital converter 121. In addition, the sums V1 of voltage drops across the gate module 110 and sampling module 150 in each state are all less than or equal to 50 mV.

In a practical application, since the current range of the circuit to be measured 110 in the SDRAM chip is 10 uA-500 mA, the above state combinations may be simplified, and three of the state combinations, i.e., state 1, state 2 and state 3, may be selected to meet the measurement range of 10 μA-500 mA.

In an exemplary implementation of the embodiments of the disclosure, the specific measurement ranges of the three states are adjusted, and the adjusted results are shown in Table 2.

TABLE 2

| State | Resistance value of sampling module | $V_1$ | Amplification | $V_2$ | I |
|---|---|---|---|---|---|
| 1 | 50 mΩ | 22 mV-49.955 mV | 10 | 200 mV-454.5 mV | 400 mA-909 mA |
| 2 | 50 mΩ | 0.11 mV-22 mV | 100 | 10 mV-2 V | 2 mA-400 mA |
| 3 | 10 Ω | 0.1 mV-20.01 mV | 100 | 10 mV-2 V | 10 μA-2 mA |

Figure 3:
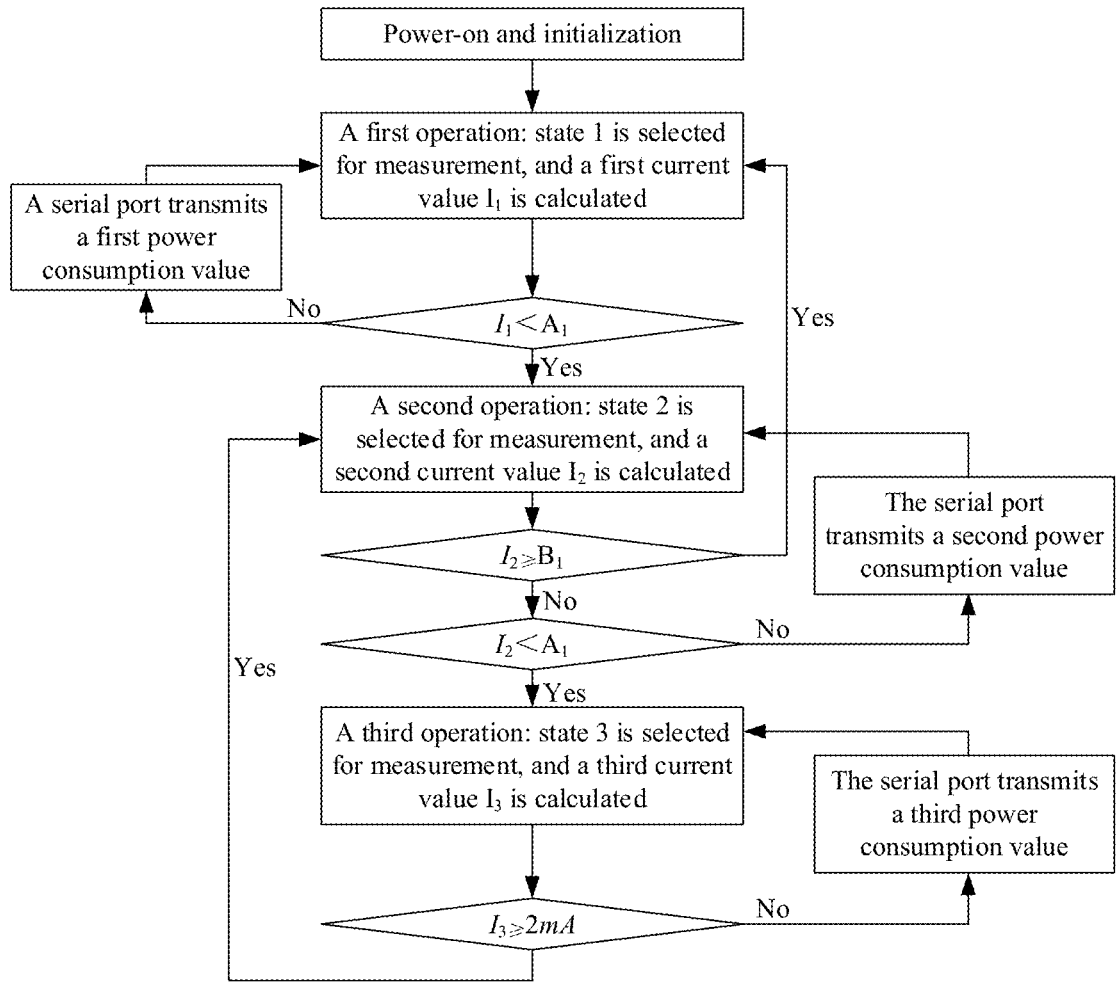
FIG. 3 schematically illustrates a flowchart of a state conversion procedure on a processing module according to an exemplary implementation of the embodiments of the disclosure.

Referring to FIG. 3, FIG. 3 schematically illustrates a flowchart of a state conversion procedure on a processing module according to an exemplary implementation of the embodiments of the disclosure. The specific conversion process is performed by the control logic module, the process specifically includes the following operations.

Firstly, each of components is powered on and initialized.

After the initialization, a first operation is performed. The gating module is controlled to gate the sampling module with the first resistance value (for example, 50 mΩ), and the amplifying module is controlled to adjust the amplification as the first amplification (for example, 10 times), namely, state 1 is selected for measurement.

The amplifying module is controlled to acquire and amplify the voltage signal across the gated sampling module.

A first current value $I_1$ and a first power consumption value corresponding to the amplified voltage signal are calculated.

The first current value $I_1$ is compared with a first lower limit value $A_1$ (400 mA) of a measurable current range (400 mA-909 mA) corresponding to the first resistance value and the first amplification, to determine whether the first current value is less than the first lower limit value.

If yes, the procedure jumps to a second operation, which indicates that the state 1 is not able to be used for measuring the current range, and the combination of state 2 is selected to measure current I.

If no, the first power consumption value is transmitted to the upper computer through the serial port of the processing module, and the procedure proceeds to the first operation.

At the second operation, the gating module is controlled to gate the sampling module with the first resistance value (for example, 50 mΩ), and the amplifying module is controlled to adjust the amplification as the second amplification (for example, 100 times), namely, state 2 is selected for measurement.

The amplifying module is controlled to acquire and amplify the voltage signal across the gated sampling module.

A second current value $I_2$ and a second power consumption value corresponding to the amplified voltage signal are calculated.

The second current value $I_2$ is compared with a second lower limit value $A_2$ (2 mA) of a measurable current range (2 mA-400 mA) corresponding to the first resistance value and the second amplification and a first upper limit value $B_1$ (400 mA) of the measurable current range (2 mA-400 mA) corresponding to the first resistance value and the second amplification, to determine whether the second current value is less than the second lower limit value, and whether the second current value is greater than or equal to the first upper limit value.

If the second current value is less than the second lower limit value, the procedure jumps to a third operation, which indicates that the state 2 is not able to be used for measuring the current range, and the combination of state 3 is selected to measure current I.

If the second current value is greater than the first upper limit value, the procedure jumps to the first operation, which indicates that the state 2 is not able to be used for measuring the current range, and the combination of state 1 is selected to measure current I.

If no, the second power consumption value is transmitted to the upper computer through the serial port, and the procedure proceeds to the second operation.

At the third operation, the gating module is controlled to gate the sampling module with the second resistance value (for example, 10Ω), and the amplifying module is controlled adjust the amplification as the second amplification (for example, 100 times), namely, state 3 is selected for measurement.

The amplifying module is controlled to acquire and amplify the voltage signal across the gated sampling module.

A third current value $I_3$ and a third power consumption value corresponding to the amplified voltage signal are calculated.

The third current value $I_3$ is compared with a second upper limit value $B_2$ (2 mA) of a measurable current range (10 μA-2 mA) corresponding to the second resistance value and the second amplification, to determine whether the third current value is greater than or equal to the second upper limit value.

If yes, the procedure jumps to the second operation, which indicates that the state 3 is not able to be used for measuring the current range, and the combination of state 2 is selected to measure current I.

If no, the third power consumption value is transmitted to the upper computer through the serial port, and the procedure proceeds to perform the third operation.

In a practical application, the upper computer 200 may be a computer that directly issues a control command, generally be a Personal Computer (PC), a host computer, a master computer, an upper computer, and the screen of the upper computer may display various signal values (for example, a maximum power consumption, a minimum power consumption and an average power consumption). The command from the upper computer 200 is firstly transmitted to the processing module 120, and then the processing module 120 interprets the command into a corresponding timing sequence signal so as to control the operation of the corresponding components directly. The processing module 120 feeds back the calculated current value and power consumption value to the upper computer 200 through the serial port 122.

Figure 4:
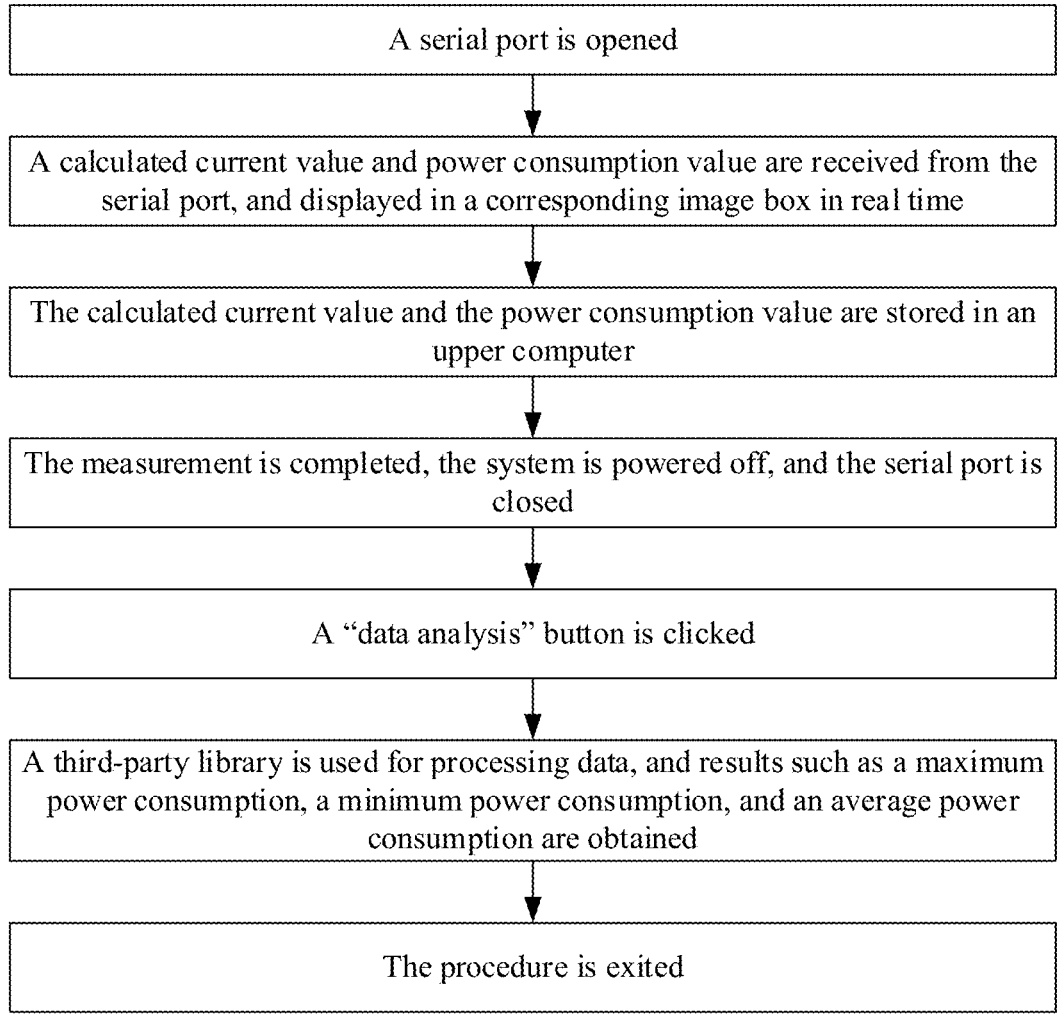
FIG. 4 schematically illustrates a flowchart of a procedure on an upper computer according to an exemplary implementation of the embodiments of the disclosure.

In an exemplary implementation, the upper computer 200 may use Python language for programming, and use the strong third-party extension library to perform the graphical display and data analysis and mining of the measurement result. Specific operation flow may refer to FIG. 4, FIG. 4 schematically illustrates a flowchart of a procedure on an upper computer according to an exemplary implementation of the embodiments of the disclosure.

Firstly, the serial port is opened, the current value and power consumption value calculated by the processing module are received from the serial port, and displayed on a corresponding image box in real time. Then, the current value and power consumption value are stored in the upper computer, for example, the current value and power consumption value are stored into different Comma-Separated Values (CSV) (or character-separated values) files, in which table data is stored in a form of plain text. After the measurement of the power consumption measurement assembly is completed, the system of the upper computer is powered off, and the serial port is closed. A "data analysis" button on the screen is clicked to enable the third-party extension library such as Python to process the data, and results such as the maximum power consumption, the minimum power consumption and the average power consumption are obtained. Finally, the procedure is exited.

In an exemplary implementation of the embodiments of the disclosure, a chip power consumption measurement device is further provided. In the following, the description of the power consumption measurement assembly 100 in the exemplary embodiments being applied in the chip 300 to obtain the chip power consumption measurement device is illustrated.

Figure 5:
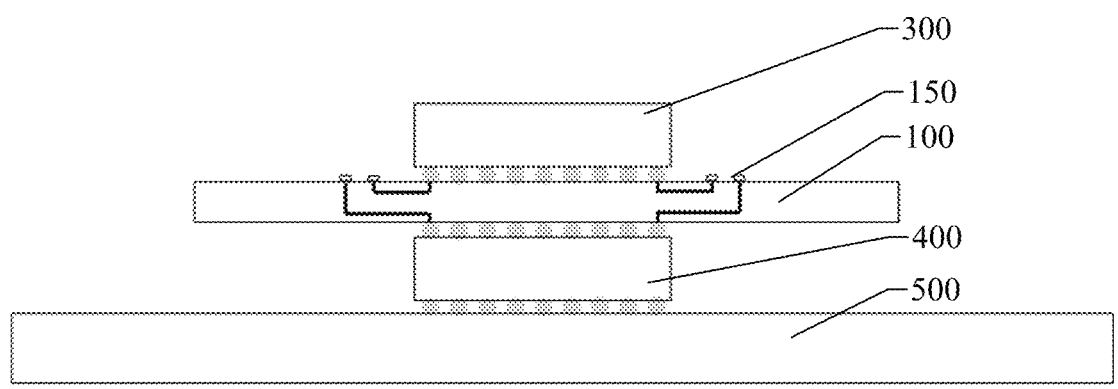
FIG. 5 schematically illustrates a schematic diagram of a structure of a chip power consumption measurement device according to an exemplary implementation of the embodiments of the disclosure FIG. 6 schematically illustrates a schematic diagram of a structure of another chip power consumption measurement device according to an exemplary implementation of the embodiments of the disclosure.

Referring to FIG. 5, FIG. 5 schematically illustrates a schematic diagram of a structure of a chip power consumption measurement device according to an exemplary implementation of the embodiments of the disclosure. As illustrated in FIG. 5, the chip power consumption measurement device specifically includes a chip 300 and the above power consumption measurement assembly 100. The at least two sampling modules 150 of the power consumption measurement assembly 100 are respectively connected to a power supply pin of the chip 300 in series, and configured to calculate the power consumption on the power supply. The specific details of the above power consumption measurement assembly 100 have been described in detail in the above implementations, and will not be elaborated herein.

In a practical application, the chip 300 may be one of various chips such as a

SDRAM chip and a CPU chip. In an exemplary implementation of the embodiments of the disclosure, the SDRAM chip is taken as an example to describe the chip power consumption measurement device, and other types of chips be implemented with reference to the SDRAM chip.

The SDRAM chip is generally installed on a mainboard 500, thus the power consumption measurement assembly 100 is arranged between the SDRAM chip and the mainboard 500. All power supply signals of the SDRAM chip are extended from the bottom layer of the SDRAM chip and connected to the sampling module 150 of the power consumption measurement assembly 100 in series, and then are connected to the power supply pin of the SDRAM chip.

Referring to FIG. 5, in addition to the above power consumption measurement assembly 100, the chip power consumption measurement device may further include an uplift plate 400, the uplift plate 400 may be arranged between the power consumption measurement assembly 100 and the mainboard 500, so as to uplift the power consumption measurement assembly 100. Since a size of the power consumption measurement assembly 100 is generally greater than that of the SDRAM chip, the uplift plate is arranged on the mainboard 500 to uplift the power consumption measurement assembly 100, thus interference between the power consumption measurement assembly 100 and lateral components of the SDRAM chip can be avoided.

The position of the uplift plate 400 is the position where the SDRAM chip is originally arranged on the mainboard 500, therefore, a size of the uplift plate 400 may be designed based on the size of the SDRAM chip. For example, a cross-section dimension of the uplift plate 400 is the same as that of the SDRAM chip, and a height of the uplift plate 400 is greater than or equal to a thickness of the SDRAM chip. For example, the height of the uplift plate 400 may be 1.5-2.5 mm, which is not specifically limited in the exemplary implementation.

Figure 6:
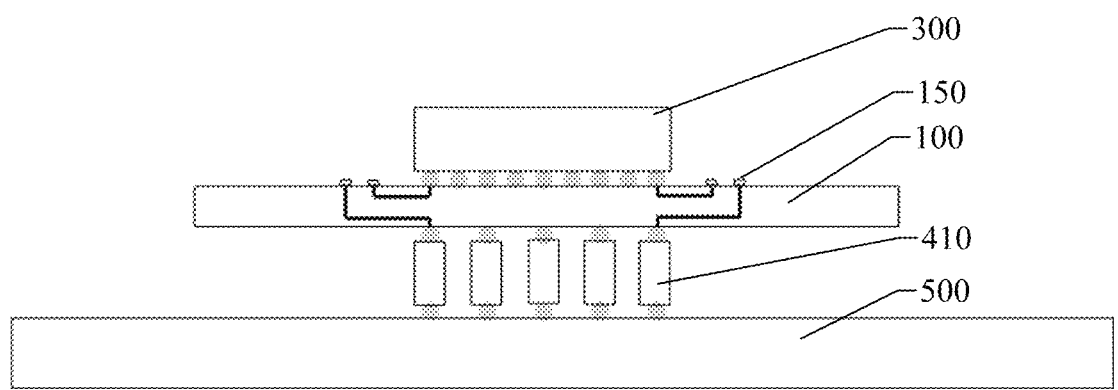

Referring to FIG. 6, FIG. 6 schematically illustrates a schematic diagram of a structure of another chip power consumption measurement device according to an exemplary implementation of the embodiments of the disclosure. As illustrated in FIG. 6, the uplift plate 400 may be set to include a plurality of sub-uplift plates 410, which are separately arranged between the power consumption measurement assembly 100 and the mainboard 500, so as to facilitate the heat radiation of the power consumption measurement assembly 100.

In an exemplary implementation of the embodiments of the disclosure, the uplift plate 400 may be one of: and epoxy plate, an epoxy resin plate, a brominated epoxy resin plate, a glass fiber plate, a fiberglass board, a reinforcing plate of a flexible printed circuit board, a flame retardant insulation plate, an epoxy glass cloth plate, epoxy glass cloth laminated plate or a drilling shim plate of a circuit board, etc.

In conclusion, according to the chip power consumption measurement device provided with the above power consumption measurement assembly in the exemplary embodiments, the control logic module in the processing module may determine the combination manner of the gated sampling module and the amplification of the amplifying module based on the current range of the circuit to be measured, the convertible voltage range of the analog-digital converter and the voltage drop range of the gating module and the gated sampling module. Different current measurement ranges may be obtained through various different combinations, so as to satisfy the actual measurement requirements. Moreover, the components used in the measurement process are common components, instead of high-end current measurement components with a high precision, therefore, the measurement cost of the measurement device is relatively low, and the user requirements can be further satisfied.

Other embodiments of the embodiments of the disclosure will be apparent to those skilled in the art from consideration of the specification and practice of the disclosure disclosed herein. The disclosure is intended to cover any variations, uses, or adaptations of the embodiments of the disclosure, and the variations, uses, or adaptations following the general principles thereof and including such departures from the embodiments of the disclosure as come within known or customary practice in the art. The specification and embodiments are considered as exemplary only, with a true scope and spirit of the embodiments of the disclosure being indicated by the claims.

It should be understood that the embodiments of the disclosure are not limited to the exact construction that has been described above and illustrated in the accompanying drawings, and that various modifications and changes may be made without departing from the scope thereof. The scope of the embodiments of the disclosure is limited only by the appended claims.

What is claimed is:

1. A power consumption measurement assembly, applied to a circuit to be measured, the power consumption measurement assembly comprising:
   at least two sampling circuitries, respectively connected to the circuit to be measured in series;
   a gating circuitry, configured to gate one of the at least two sampling circuitries;
   an amplifying circuitry, configured to acquire and amplify a voltage signal across the gated sampling circuitry; and
   a processing circuitry, connected to the gating circuitry and the amplifying circuitry, and configured to: control and adjust the gated sampling circuitry and select an amplification of the amplifying circuitry based on the gated sampling circuitry, calculate a power consumption value based on the amplified voltage signal and a combination of the gated sampling circuitry and the selected amplification of the amplifying circuitry, and transmit the power consumption value.

2. The power consumption measurement assembly of claim 1, wherein the processing circuitry comprises:
   an analog-digital converter, connected to the amplifying circuitry and configured to convert the voltage signal to a digital signal;
   a calculation circuitry, configured to calculate the power consumption value based on the digital signal;
   a control logic circuitry, configured to control and adjust the gated sampling circuitry and select the amplification of the amplifying circuitry; and
   a serial port, configured to connect to an upper computer and transmit the power consumption value to the upper computer.

3. The power consumption measurement assembly of claim 2, wherein the control logic circuitry is specifically configured to:
   determine the gated sampling circuitry and the amplification of the amplifying circuitry based on a current range of the circuit to be measured, a convertible voltage range of the analog-digital converter and a voltage drop range of the gating circuitry and the gated sampling circuitry.

4. The power consumption measurement assembly of claim 2, wherein the amplifying circuitry comprises at least two channels, an input of each of the at least two channels is connected to two ends of a respective one of the at least two sampling circuitries, and an output of each of the at least two channels is connected to the analog-digital converter.

5. The power consumption measurement assembly of claim 1, wherein the at least two sampling circuitries are at least two sampling resistors, the at least two sampling resistors have different resistance values, and the amplifying circuitry comprises at least two selectable amplifications.

6. The power consumption measurement assembly of claim 5, wherein a resistance value range of each of the at least two sampling resistors is 50 mΩ-10Ω, and an amplification range of the amplifying circuitry is 10 times-200 times.

7. The power consumption measurement assembly of claim 1, further comprising a substrate, and wherein
   the at least two sampling circuitries, the gating circuitry, the amplifying circuitry and the processing circuitry are arranged on the substrate.

8. A power consumption measurement method, applied to a power consumption measurement assembly, the method comprising:
   controlling and adjusting a gated sampling circuitry of the power consumption measurement assembly and selecting an amplification of an amplifying circuitry of the power consumption measurement assembly based on the gated sampling circuitry;
   acquiring and amplifying a voltage signal across the gated sampling circuitry; and
   calculating a power consumption value based on the amplified voltage signal and a combination of the gated sampling circuitry and the selected amplification of the amplifying circuitry, and transmitting the power consumption value.

9. The method of claim 8, further comprising:
   performing a current acquiring, wherein the current acquiring comprises controlling a gating circuitry of the power consumption measurement assembly to gate a sampling circuitry and selecting the amplification of the amplifying circuitry;
   controlling the amplifying circuitry to acquire and amplify the voltage signal across the gated sampling circuitry;
   calculating a current value and a power consumption value corresponding to the amplified voltage signal;
   comparing the current value with a measurable current range of the power consumption measurement assembly;
   in response to the current value being in the measurable current range, transmitting the power consumption value and proceeding to the current acquiring; and
   in response to the current value being not in the measurable current range, adjusting at least one of the gated sampling circuitry or the amplification of the amplifying circuitry, and proceeding to the current acquiring.

10. A chip power consumption measurement device, comprising:
    a chip;
    a power consumption measurement assembly, wherein the power consumption measurement assembly comprises:
       at least two sampling circuitries respectively connected to the chip in series;
       a gating circuitry, configured to gate one of the at least two sampling circuitries;
       an amplifying circuitry, configured to acquire and amplify a voltage signal across the gated sampling circuitry; and
       a processing circuitry, connected to the gating circuitry and the amplifying circuitry, and configured to: control and adjust the gated sampling circuitry and an amplification of the amplifying circuitry, calculate a power consumption value based on the amplified voltage signal and transmit the power consumption value; and
    an uplift plate, arranged between the power consumption measurement assembly and a mainboard where the chip is arranged, and configured to uplift the power consumption measurement assembly,
    wherein the at least two sampling circuitries of the power consumption measurement assembly are respectively connected to a power supply pin of the chip in series.

11. The device of claim 10, wherein a cross-section dimension of the uplift plate is the same as a cross-section dimension of the chip, and a height of the uplift plate is greater than or equal to a thickness of the chip.

12. The device of claim 10, wherein the uplift plate is one of: an epoxy plate, an epoxy resin plate, a brominated epoxy resin plate, a glass fiber plate, a fiberglass plate, a reinforcing plate of a flexible printed circuit board, a flame retardant insulation plate, an epoxy glass cloth plate, an epoxy glass cloth laminated plate or a drilling shim plate of a circuit board.

13. The device of claim 10, wherein the uplift plate comprises a plurality of sub-uplift plates, and the plurality of sub-uplift plates are separately arranged between the power consumption measurement assembly and the mainboard.

14. The device of claim 10, wherein the chip is one of a Synchronous Dynamic Random Access Memory (SDRAM) chip or a Central Processing Unit (CPU) chip.

15. The device of claim 10, wherein the processing circuitry comprises:
   an analog-digital converter, connected to the amplifying circuitry and configured to convert the voltage signal to a digital signal;
   a calculation circuitry, configured to calculate the power consumption value based on the digital signal;
   a control logic circuitry, configured to control and adjust the gated sampling circuitry and the amplification of the amplifying circuitry; and
   a serial port, configured to connect to an upper computer and transmit the power consumption value to the upper computer.

16. The device of claim 15, wherein the control logic circuitry is specifically configured to:
   determine the gated sampling circuitry and the amplification of the amplifying circuitry based on a current range of the chip, a convertible voltage range of the analog-digital converter and a voltage drop range of the gating circuitry and the gated sampling circuitry.

17. The device of claim 15, wherein the amplifying circuitry comprises at least two channels, an input of each of the at least two channels is connected to two ends of a respective one of the at least two sampling circuitries, and an output of each of the at least two channels is connected to the analog-digital converter.

18. The device of claim 10, wherein the at least two sampling circuitries are at least two sampling resistors, the at least two sampling resistors have different resistance values, and the amplifying circuitry comprises at least two selectable amplifications.

19. The device of claim 18, wherein a resistance value range of each of the at least two sampling resistors is 50 mΩ-10Ω, and an amplification range of the amplifying circuitry is 10 times-200 times.

* * * * *